United States Patent [19]

Itoh

[11] 3,940,698
[45] Feb. 24, 1976

[54] MUTING CIRCUIT

[75] Inventor: Yasuo Itoh, Tokyo, Japan

[73] Assignee: Victor Company of Japan, Limited, Yokohama, Japan

[22] Filed: May 17, 1973

[21] Appl. No.: 361,218

[30] Foreign Application Priority Data

May 24, 1972 Japan.............................. 47-51496

[52] U.S. Cl...... 325/348; 179/1 GQ; 179/100.4 ST; 307/233 R; 325/478; 328/138
[51] Int. Cl.².......................................... H04B 1/10
[58] Field of Search ........... 325/478, 402, 403, 348, 325/395; 179/15 BT, 1 GQ, 100.4 ST; 307/233; 328/138

[56] References Cited
UNITED STATES PATENTS

| | | | |
|---|---|---|---|
| 3,325,738 | 6/1967 | Busby et al. ......................... | 325/477 |
| 3,628,058 | 12/1971 | Espe ................................... | 325/478 |
| 3,660,765 | 5/1972 | Glasser et al. ...................... | 325/478 |
| 3,662,113 | 5/1972 | Von Recklinghausen ...... | 179/15 BT |
| 3,686,471 | 8/1972 | Takahashi ................. | 179/100.4 ST |

*Primary Examiner*—Howard W. Britton
*Assistant Examiner*—Marc E. Bookbinder

[57] ABSTRACT

A muting circuit comprises, substantially, a gate circuit for passing or not passing input signals and a circuit for forming a control signal for controlling the gating operation of the gate circuit. The control signal forming circuit has a circuit for detecting the level of a carrier wave in the input signal. A first time constant circuit has a very small time constant $\tau_1$. A second time constant circuit exhibits a delay time constant of $\tau_2$ (where $\tau_2 \gg \tau_1$) when a carrier wave component exists in the input and a delay time constant which becomes substantially zero when a carrier wave component does not exist. A third time constant circuit of a time constant $\tau_3$ (where $\tau_3 > \tau_2$) is with a 180° phase relationship relative to the second time constant circuit.

15 Claims, 27 Drawing Figures

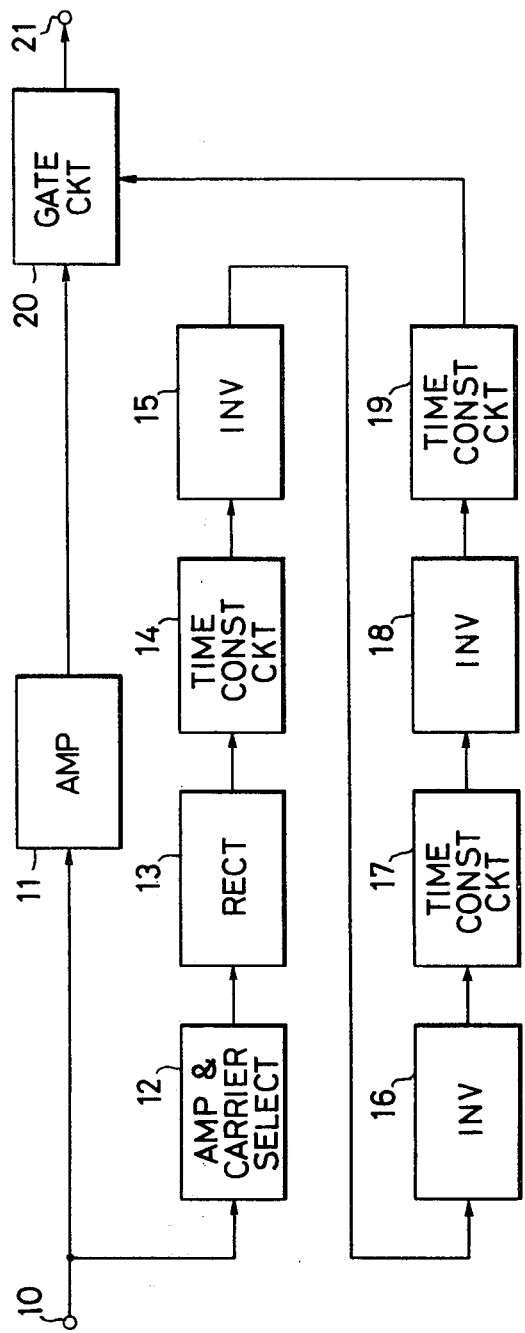

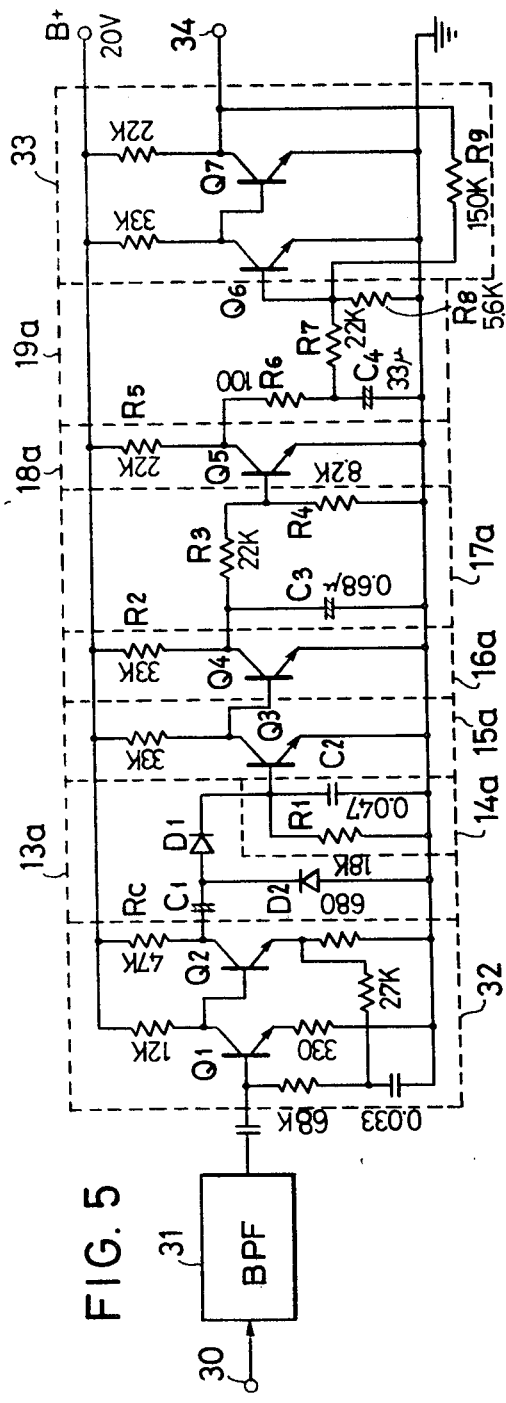

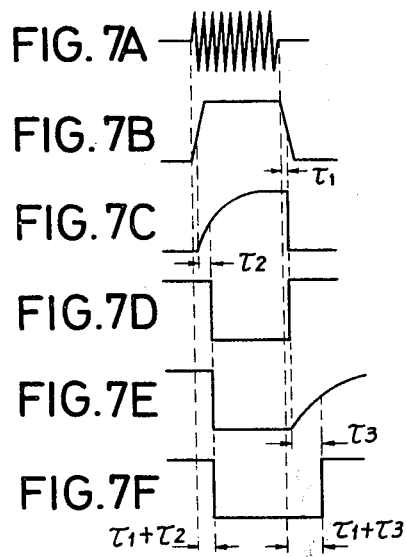
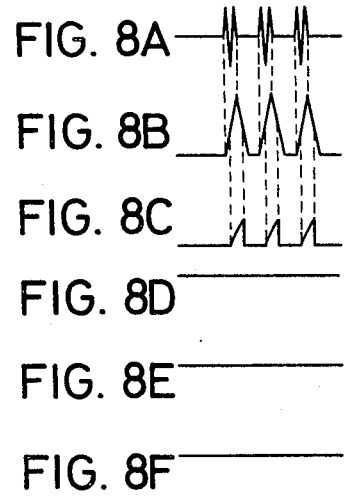
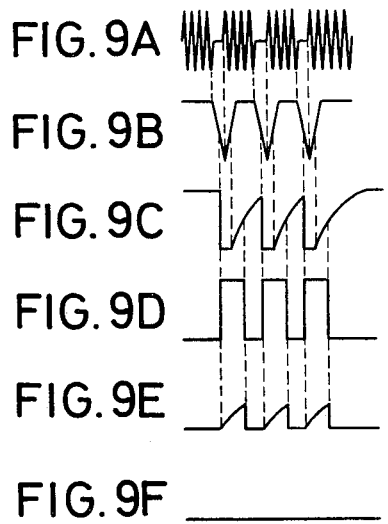

MUTING CIRCUIT

BACKGROUND OF THE INVENTION

This invention relates generally to a muting circuit and more particularly to a circuit for muting a multichannel disc reproducing or playback apparatus, in the case where there is no reproduced angular modulated wave component.

In general, in a multichannel disc reproducing apparatus of a compatible, discrete 4-channel (CD-4) system, the reproduced signal is a superposed signal of a direct wave signal and an angular modulated wave signal. A 2-channel stereo record does not contain an angular modulated wave signal. If it is to be played in a reproducing apparatus capable of playing back a multichannel disc of this CD-4 system, it is necessary to cut off the demodulation system for angular modulated waves and to prevent noise from this demodulation system from being sent to the succeeding circuits.

For this purpose, heretofore, a muting circuit has been used for cutting off the demodulation system for angular modulated waves. A muting circuit for this purpose comprises, essentially, a muting control circuit for detecting the presence or absence of an angular modulated carrier wave and for generating a corresponding detection output signal, and a muting gate circuit for carrying out gating operation controlled by this detection output circuit.

While a muting control circuit in a muting circuit of known type is capable of positively detecting the presence or absence of an angular modulated wave component in a reproduced signal when such a component exists, it is incapable of positively detecting the absence of an angular modulated wave component in the reproduced signal. For example, sometimes an angular modulated wave does not exist in the reproduced signal but, a high frequency is in the audio frequency band, which does not have a carrier wave from the beginning. This frequency band is generated at the time of tracing of the 2-channel record disc, and it exists within the angular modulated carrier wave band. A muting control circuit of a known type inevitably detects this high-frequency component. In this case, therefore, this known muting circuit carries out an erroneous operation, and noise is generated in the reproduced sound.

Furthermore, in the case where an angular modulated wave within the reproduced signal is interrupted instantaneously and intermittently, a known muting circuit accomplishes muting in an intermittent manner. The resulting reproduced sound becomes discontinuous and unpleasant to the ear.

SUMMARY OF THE INVENTION

Accordingly, it is a general object of the present invention to provide a novel and useful muting circuit in which the above described difficulties accompanying known muting circuits have been overcome.

More specifically, an object of the invention is to provide a muting circuit in which there is no possibility of erroneous operation due to irregular noise components in the input signals.

Another object of the present invention is to provide a muting circuit in which, even when there is an instantaneous interruption in the carrier wave component, there is no possibility of intermittent muting occurring and giving rise to discontinuity in the reproduced sound.

Other objects and further features of the present invention will be apparent from the following detailed description with respect to preferred embodiment of the invention, when read in conjunction with the accompanying drawings as briefly described below, in which like parts are designated by like reference numerals and characters.

BRIEF DESCRIPTION OF THE DRAWINGS

In the drawings:

FIG. 1 is a block diagram of one embodiment of a muting circuit according to the invention;

FIGS. 2A and 2B are waveform graphs respectively showing a normal carrier waveform and an envelope waveform of one side thereof;

FIGS. 3A and 3B are waveform graphs respectively showing the waveform of a carrier having noise and an envelope waveform of one side thereof;

FIGS. 4A and 4B are waveform graphs respectively showing the waveform of a carrier having an instantaneous interruption and an envelope waveform of one side thereof;

FIG. 5 is a circuit diagram showing one embodiment of a specific electrical circuit of the block system illustrated in FIG. 1;

FIG. 6 is a circuit diagram showing another embodiment of a specific electrical circuit of the block system illustrated in FIG. 1;

FIGS. 7A through 7F are waveform graphs respectively showing waveforms of signals at various parts in the circuit shown in FIG. 5 in the case where the carrier waveform is normal;

FIGS. 8A through 8F are waveform graphs respectively showing waveforms of signals at various parts in the circuit shown in FIG. 5 in the case where there is noise in the carrier; and FIGS. 9A through 9F are waveform graphs respectively showing waveforms of the signals in the case where there is an instantaneous interruption in the carrier.

DETAILED DESCRIPTION

The block diagram shown in FIG. 1 indicates the essential organization of one embodiment of a muting circuit according to the present invention. This invention is incorporated in a demodulation system for angular modulated waves in a multichannel disc playback device. An angular modulated wave component is picked up by a pickup cartridge from a 4-channel disc (not shown). The modulated wave is separated from the direct wave signal. Then, it enters the system via an input terminal 10 and is supplied to an amplifier 11 and an amplifying and carrier selection circuit 12.

The carrier selection circuit 12 has a resonance circuit which resonates at the center frequency (30 KHz) of the carrier wave of the angular modulated wave and operates to select and derive the carrier wave component. This component is rectified in the succeeding rectifying circuit 13 and then supplied to a time constant circuit 14.

If the carrier wave component, within the input signal entering through the input terminal 10, has a normal waveform as indicated in FIG. 2A, the waveform of the envelope on one side thereof is substantially flat as indicated in FIG. 2B. On the other hand, if there is an irregular noise component, other than the carrier wave in the carrier wave component, the waveform of the carrier wave component containing the noise component is as indicated in FIG. 3A. Then, waveform of the envelope on one side thereof becomes as indicated in FIG. 3B. Furthermore, in the case where there is an instantaneous interruption in the carrier wave, the waveform of the resulting carrier wave component becomes as indicated in FIG. 4A, and the waveform of the envelope of one side thereof becomes as indicated in FIG. 4B.

The circuit of the invention is adapted so that the muting circuit is prevented from muting each time there is an instantaneous interruption in the carrier as indicated in FIGS. 4A and 4B. Accordingly, it is necessary to detect, as reliably as possible, the input envelope of each input signal to determine whether the input signal is a carrier wave component of a continuous signal or whether it is a discontinuous noise. This function is carried out by the above mentioned time constant circuit 14. In this instance, it is necessary to attenuate as much as possible, the ripple component of the carrier wave component.

The output signal of the time constant circuit 14 is supplied to an inverter 15. This inverter 15 operates in accordance with the magnitude of the envelope of the input signal and carries out an on-off switching operation each time that the envelope crosses a certain specific level. The output signal of the inverter 15 is supplied to a succeeding inverter 16, where waveshaping and phase inversion are carried out. The output signal of the inverter 16 is transmitted successively to a time constant circuit 17, an inverter 18, and a time constant circuit 19.

The time constant circuits 17 and 19, differ from an integration circuit of general type. They exhibit certain integration time constants in the on-level direction, together with the inverters 16 and 18 of their respective preceding stages. With respect to the off-level, these circuits carry out operations such that the time constants become small, ideally zero. The time constant circuit 19 is connected with a phase difference of 180°, relative to the time constant circuit 17.

For the following description, the time constants in the on-level direction of the time constant circuits 17 and 19 will be represented respectively by the symbols $\tau_2$ and $\tau_3$. The inverter 16 assumes an "on" state when a carrier wave exists and an "off" state when a carrier wave does not exist. In the case where there is noise in the carrier wave band and the carrier wave envelope is discontinuous as in FIG. 3B, the inverter 16 assumes an "off" state when the period of its continuous part is less than $\tau_2$ and assumes an "on" state when the period is greater than $\tau_2$. Therefore, by setting the above mentioned time constants at appropriate values, it is possible to distinguish between the carrier wave component and a discontinuous noise picked up from a multichannel disc.

Under the condition of normal reproduction or playback of a multichannel disc, the carrier does not develop a discontinuous part. However, if dust is on the disc surface or if the trace of the pickup cartridge on the disc is poor, the carrier wave component within the reproduced signal may be interrupted as indicated in FIG. 4A. In such a case, the time constant circuit 17 responds. The muting gate circuit assumes an "off" state, and the signal is cut off, for a period $\tau$off + $\tau_2$ which is the sum of the time $\tau_{off}$ during which the carrier wave is interrupted and the time constant $\tau_2$ of the time constant circuit 17, and a discontinuity which occurs in the reproduced sound. Accordingly, in order to prevent this discontinuity in the reproduced sound, the time constant circuit 19 is provided thereby to afford an allowance period $\tau_3$, with respect to the discontinuity of the carrier wave.

The output of this time constant circuit 19 is applied to a gate circuit 20, to control the gating operation thereof. Accordingly, the signal from the aforementioned amplifier 11 is passed or not passed through the gate circuit 20 depending on the signal from the time constant circuit 19, and muting is thus accomplished. The output of the gate circuit 20 is led out of this muting circuit through an output terminal 21.

Depending on the type of the gate circuit 20 used, a waveshaping circuit comprising an inverter may be further provided in the last stage of the time constant 19. The output of this waveshaping circuit is applied to the gate circuit 20.

Accordingly, the relationships of the time constant circuits 14, 17 and 19 in the system illustrated by the block diagram in FIG. 1 may be summarized as follows. The first time constant circuit 14 carries out switching with a very short time constant $\tau_1$, with respect to the detection output of the carrier wave component selection level. The second time constant circuit 17 is connected to the last stage of the first time constant circuit 14 to carry out switching, with a delayed time constant $\tau_2$ ($\tau_2 >> \tau_1$), when a carrier wave component exists in the output of the time constant circuit 14. This delayed time constant becomes substantially zero when there is no carrier wave component. The third time constant circuit 19 is connected with a 180-degree phase relationship relative to the second time constant circuit 17 and has a time constant $\tau_3$, such as to accomplish compensation with respect to interruptions of carrier waves which are less than the time constant $\tau_3$ - $\tau_2$. That is, the gate circuit remains in a signal passing state.

One embodiment of a concrete electrical circuit including the essential parts of the system is shown by block diagram in FIG. 1 and illustrated in FIG. 5. A signal reproduced from a multichannel disc (not shown) enters the circuit through an input terminal 30. Then, it is passed through a high-pass filter or a bandpass filter 31, which extracts therefrom an angular modulated, difference signal component, which is amplified by a two stage, directcoupled amplifier 32 comprising transistors Q1 and Q2, in order to obtain a specific muting operation sensitivity. The carrier wave component thus amplified is voltage doubled by a rectifying circuit 13a comprising diodes D1 and D2, from which a DC output is obtained in accordance with the carrier wave level. That is, envelope detection is here carried out. The rectification time constant of the rectifying circuit 13a is made as small as possible in order to detect reliably the envelope of the carrier wave component.

The output of the rectifying circuit 13a acquires a time constant factor as it passes through a time constant circuit 14a, comprising a resistor R1 and a capacitor C2. The time constant $\tau_1$ of the time constant circuit 14a is determined, strictly speaking, by the constants of a resistor Rc, the diodes D1 and D2, the capacitors C1 and C2, and the resistor R1. In this case, it is desirable for this time constant $\tau_1$ be as small as possible, since the delay of the envelope detection decreases with the value of this time constant $\tau_1$. However, there is a lower limit to the value of this time constant $\tau_1$ since there is a smoothing effect to such an extent that a transistor Q4 of the inverter 16a will not respond to the "on" and "off" effect caused by the ripple component of the carrier wave frequency.

The inverter 15a has a transistor Q3 which carries out switching at a specific input level and which drives the transistor Q4 of the inverter 16a. Here, with respect to an input carrier wave of a waveform as shown in FIG. 7A, an envelope (including $\tau_1$) is obtained as indicated in FIG. 7B responsive to the output of the time constant circuit 14a. Further, a signal of a waveform indicated in FIG. 7C is obtained from the output of the transistor Q4. The time constant circuit 17a, comprises a capacitor C3 and resistors R3 and R4, and is connected to the output circuit of the transistor Q4. The output waveform of this time constant circuit 17a has a time constant only in the "on" direction.

When there is no carrier wave component in the input signal, or, even when there is a carrier wave component but its level is below the muting level, the transistor Q3 of the inverter 15a assumes an "off" state. Consequently, the transistor Q4 of the inverter 16a comes "on". The charge in the capacitor C3 is discharged by the resistance of the transistor Q4 in its conductive state. This resistance is in the order of a number of tens of ohms. The falling time due to the discharge is of the order of microseconds.

When, contrary to the above case, the level of the input carrier wave component is above the muting level, the transistor Q4 becomes cut off and thus causes a transistor Q5 of the inverter 18a to assume the "on" state through the time constant circuit 17a. That is, strictly speaking, time circuit 17a, of a time constant $\tau_2$, includes the resistors R2, R3 and R4, and the input resistance of the transistor Q5, and the capacitor C3. The manner in which the transistor Q5 assumes the conductive state, with a delay of $\tau_2$, is indicated in FIGS. 7D and 7E. FIG. 7D indicates the waveform in the case where the capacitor C4 of the time constant circuit 19a is neglected. FIG. 7E indicates the waveform in the case where this capacitor C4 is considered.

The output signal of the time constant circuit 19a is passed through a waveshaping circuit 33 and then led out through an output terminal 34. The "on" and "off" waveform of the muting control signal led out through the output terminal 34 is shown in FIG. 7F.

Next, when a noise component, as indicated in FIG. 8A, enters as an input signal into the circuit shown in FIG. 5, the envelope waveform thereof becomes as indicated in FIG. 8B. The waveform of the output of the transistor Q4 becomes as indicated in FIG. 8C. Consequently, the level of the discontinuous carrier wave component, below the time component $\tau_2$, becomes lower than the "on" level of the time constant circuit 17a, and the gate circuit is held in the "off" state, whereby the signal is cut off and the muting effect is obtained. This is accomplished through a utilization of the property whereby the time constant circuit 17a operates only at the time of the "on" state. The time constant at the time of the "off" state is extremely small. When there is a carrier wave input, the transistor Q4 is in a position to be cut off, whereby the above stated property can be utilized. At the time of disc reproduction or playback, the noise component entering into the carrier wave band always becomes a discontinuous wave as indicated in FIG. 8A relative to audio signals. Good results can be obtained by a circuit having the circuit element constants indicated in FIG. 5.

An example of a waveform resulting from an instantaneous drop out in an input carrier wave, at the time of playback of a multichannel disc, is shown in FIG. 9A. The envelope waveform thereof will be as indicated in FIG. 9B. At the instant of the drop out, the transistor Q4 causes the capacitor C3 to discharge. The output of the succeeding stage acquires an intermittent waveform as indicated in FIG. 9D, the reproduced sound then becoming unnatural. However, for the stage succeeding the inverter 18a, the time constant circuit 19a, of a time constant $\tau_3$, is provided. In the case where the duration of the drop out is less than $\tau_3 - \tau_2$ it does not exceed the "on" level as indicated in FIG. 9E, and the gate circuit is maintained in the "on" state, whereby muting is not carried out responsive to the instantaneous drop out of the carrier wave. In the circuit of the instant embodiment, the time constant $\tau_3$ is selected to have a value in the order of 0.2 to 0.3 second.

In the circuit illustrated in FIG. 5, a resistor R6 is inserted and connected, as shown, to prevent a large transient current, due to discharging of the capacitor C4, from flowing through and damaging the transistor Q5, in the case where a capacitor C4 has a capacitance in the order of from 10 $\mu$F to 30 $\mu$F. In the circuit of the instant embodiment, the resistor R6 has a resistance value of 100 Ohms.

The aforementioned waveshaping circuit 33 is necessary for driving the gate circuit 20 and comprises transistors Q6 and Q7. A resistor R9 is connected between the collector of the transistor Q7 and the base of the transistor Q6 to provide a positive feedback circuit, having the effect of shortening the rise and fall times of the waveform.

Another embodiment of a specific electrical circuit of the essential parts of the system shown by block diagram in FIG. 1 is illustrated by a circuit diagram in FIG. 6. A reproduced signal from a multichannel disc enters through an input terminal 40 and is supplied to the amplifying and selecting circuit 12a. After being amplified by the transistor Q1, the signal is sent to a resonant circuit connected to the collector of the transistor Q2, where the center frequency component of the angular modulated carrier wave is selected. The carrier wave component thus selected is rectified by the succeeding rectifying circuit 13b comprising a full-wave rectifying circuit, and is then supplied by way of the time constant circuit 14b to the inverters 15b and 16b. The time constant $\tau_1$ of the time constant circuit 14b is selected to have a smaller value than the time constant of the time constant circuit 14a in the circuit illustrated in FIG. 5.

The output of the inverter 16b is supplied to the time constant circuit 17b comprising the transistor Q5 and the capacitor C3. In order to hold the time constant of the time constant circuit 17b (in an "off" state of the transistor Q5) at zero, irrespective of the value of the capacitor C3 and the value of the conductive resistance of the transistor Q5, a NAND gate 41 comprising transistors Q8 and Q9 and diodes D4, D5 and D6 is connected to the succeeding stage. For this reason, the time constant $\tau_2$ of the time constant circuit 17b can be set at a very large value. The ratio $\tau_2/\tau_1$ can be made greater than that in the circuit of the preceding embodiment. Thus, an even more reliable and positive muting operation can be accomplished by the circuit of the instant embodiment. In the circuit of this embodiment, the time constant $\tau_1$ of the time constant circuit 14b is set at a number of tens of micro-seconds, and the time constant $\tau_2$ of the time constant circuit 17b is set at approximately 0.2 seconds.

Further, this invention is not limited to these embodiments but various variations and modifications may be made without departing from the scope and spirit of the invention. Therefore, the appended claims are to be construed to cover all suitable equivalent circuits.

What I claim is:

1. A muting circuit comprising a cascade of circuits including at least: input terminal means; means for detecting the level of a carrier wave component in an input signal appearing at said input terminal means; first time constant means having a first time constant characteristic for producing an output therefrom with a first predetermined time constant in response to the detection of a predetermined signal strength level in the output of said level detecting means; second time constant means having a second time constant characteristic for producing an output thereof with a second time constant in response to the output of said first time constant means when a carrier wave component is detected at the input terminal means, the duration of said second time constant being longer than the duration of said first time constant, means for making said second time constant substantially zero when a carrier wave component is not detected by said level detecting means; third time constant means having a third time constant characteristic for producing an output therefrom with a third time constant in response to the output supplied from said second time constant means, the duration of said third time constant being longer than the duration of the second time constant; and means including a gate circuit coupled to said input terminal means and operating in response to the output signal supplied from said third time constant means to pass or block the input signal, said third time constant means holding said gate circuit in a conductive state to pass the signal during the period of time corresponding to the difference between the third and second time constants.

2. A muting circuit according to claim 1 which is incorporated in a multichannel disc demodulation system comprising means coupled to said input terminal means for selecting an angularly modulated carrier wave superimposed upon an unmodulated signal picked up from a multichannel disc, said level detecting means being coupled to said selecting means to detect the level of the angularly modulated carrier wave component reproduced from the multichannel disc, and means for controlling said gate circuit means responsive to the output of the third time constant means to switch between a conductive signal passing state and a non-conductive signal blocking state.

3. A muting circuit according to claim 1 which further comprises a first inverter means for switching "on-off" each time that the envelope waveform of the output signal of said first time constant means crosses a predetermined level, and a second inverter means for waveshaping and phase inverting the output signal of said first inverter.

4. A muting circuit according to claim 3 which further comprises a third inverter means connected to said second time constant means.

5. A muting circuit according to claim 3 which further comprises a NAND gate circuit means connected to said second time constant means, said NAND gate operating to cause the time constant of the second time constant means to be substantially zero when said NAND gate is in its "off" state.

6. A muting circuit according to claim 1 which further comprises a waveshaping circuit means connected to said third time constant means.

7. A muting circuit according to claim 1 in which the third time constant means is set at a value which is a longer time constant than the sum of the second time constant and the acceptable duration of interruptions in the carrier wave component of a normal input signal, and the third time constant means holds "on" the muting gate circuit while an input signal drops out for a period of time which is less than the third time constant.

8. A muting circuit according to claim 1 in which the first time constant has a duration measured in terms of tens of microseconds, the second time constant has a duration in the order of approximately 0.2 seconds, and the third time constant has a duration in the order of approximately 0.2 to 0.3 seconds.

9. A muting circuit comprising a plurality of circuit connected in cascade, said cascade comprising at least the following:

means for detecting the level of a carrier wave component in an input signal;

a first time constant circuit means responsive to said detecting means for producing an output in a waveform having a rising and falling time constant $\tau_1$;

a second time constant circuit means responsive to said first time constant circuit means for producing an output in a waveform rising with a time constant $\tau_2$ which is longer than the time constant $\tau_1$ and falling with a time constant which is shorter than constant $\tau_1$;

a third time constant circuit means responsive to said second time constant circuit means for producing an output in a waveform which falls after a predetermined delay time, corresponding to the time constant $\tau_2$, following the start of the rise of the output of the second time constant circuit means, the output wave of the third time constant circuit means rising with a time constant $\tau_3$ which is longer than the time constant $\tau_2$ following the falling of the output of the second time constant circuit means; and gate circuit means connected to receive the input signal and to be controlled responsive to the output of the third time constant circuit means, said gate circuit means passing the input signal responsive to the falling edge of the output waveform of the third time constant circuit means, and preventing the passing of the input signal with a delay of a time corresponding to the time constant $\tau_3$, said gate being placed in said non-passing condition responsive to the rising edge of the output of the third time constant circuit means.

10. A muting circuit according to claim 9 which further comprises a first inverter means for producing an output which is switched "on" or "off" each time that an envelope of the waveform of the output signal of said first time constant circuit means crosses a predetermined level, and a second inverter means for shaping and inverting the wave of the output signal of said first inverter means.

11. A muting circuit according to claim 10 which further comprises a third inverter means connected to said second time constant circuit means.

12. A muting circuit according to claim 11 in which the third inverter means produces an output with a waveform falling with a time delay corresponding to the time constant $\tau_2$ measured from the rising edge of the output of the second time constant circuit means and rising at substantially the instant of the falling of the output of the second time constant circuit means.

13. A muting circuit according to claim 9 which further comprises a wave-shaping circuit connected to said third time constant circuit means.

14. A muting circuit according to claim 9 in which the time constant $\tau_3$ of said third time constant circuit means is a value which is greater than the sum of the time constant $\tau_2$ of said second time constant circuit means and the duration of an interruption of the carrier wave component of a normal input signal, and the third time constant circuit means causes the gate circuit to pass signals with respect to an input signal drop out which is less than the time constant $\tau_3$.

15. A muting circuit according to claim 9 in which the time constant $\tau_1$ of said first time constant circuit means is measured in terms of tens of microseconds, the time constant $\tau_2$ of said second time constant circuit means being approximately 0.2 seconds, and the time constant $\tau_3$ of said third time constant circuit means being in the range of 0.2 to 0.3 seconds.

* * * * *